(12) United States Patent
Morizumi et al.

(10) Patent No.: US 9,529,134 B2
(45) Date of Patent: Dec. 27, 2016

(54) LIGHT EMITTING DEVICE

(71) Applicant: NICHIA CORPORATION, Anan-shi (JP)

(72) Inventors: Naoto Morizumi, Yoshinogawa (JP); Yukihiro Hayashi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 182 days.

(21) Appl. No.: 14/321,670

(22) Filed: Jul. 1, 2014

(65) Prior Publication Data
US 2015/0009703 A1    Jan. 8, 2015

(30) Foreign Application Priority Data

Jul. 3, 2013   (JP) ................................ 2013-139674
Nov. 21, 2013  (JP) ................................ 2013-241042

(51) Int. Cl.
| | |
|---|---|
| *F21V 9/16* | (2006.01) |
| *F21V 8/00* | (2006.01) |
| *F21K 99/00* | (2016.01) |
| *H01S 3/00* | (2006.01) |
| *F21Y 101/02* | (2006.01) |
| *H01S 5/00* | (2006.01) |

(52) U.S. Cl.
CPC ............... *G02B 6/0008* (2013.01); *F21K 9/56* (2013.01); *F21V 9/16* (2013.01); *H01S 3/0092* (2013.01); *F21Y 2101/025* (2013.01); *H01S 5/005* (2013.01)

(58) Field of Classification Search
CPC ......... G02B 6/008; G02B 6/26; H01S 3/0092; H01S 5/005; F21Y 2101/025; F21V 9/16; F21K 9/56
See application file for complete search history.

(56) References Cited

U.S. PATENT DOCUMENTS

| | | | |
|---|---|---|---|
| 2006/0279950 | A1 | 12/2006 | Hama et al. |
| 2008/0075406 | A1 | 3/2008 | Kadomi et al. |
| 2008/0116473 | A1 | 5/2008 | Sugiyama |

(Continued)

FOREIGN PATENT DOCUMENTS

| | | |
|---|---|---|
| EP | 1 903 361 A1 | 3/2008 |
| JP | 2007-027688 A | 2/2007 |

(Continued)

OTHER PUBLICATIONS

Extended European Search Report dated Nov. 25, 2014 issued in Application No. 14175440.8.

*Primary Examiner* — Peggy Neils
(74) *Attorney, Agent, or Firm* — Foley & Lardner LLP

(57) ABSTRACT

The light emitting device according to the present invention comprises a laser diode; a wavelength converting member which is configured to convert a wavelength of a light emitted from the laser diode; and a support member which is configured to support the wavelength converting member so that the light passes through two surfaces of the wavelength converting member. The wavelength converting member comprises a fluorescent material and a binder. At least one light transmissive member is disposed on at least one of these two surfaces of the wavelength converting member. The binder has a melting point higher than a melting point of the light transmissive member. The light transmissive member is fixed to the support member by fusion bonding.

18 Claims, 11 Drawing Sheets

(56) References Cited

U.S. PATENT DOCUMENTS

| | | |
|---|---|---|
| 2011/0141763 A1 | 6/2011 | Kamee et al. |
| 2012/0119638 A1* | 5/2012 | Sato .................... F21V 29/004 |
| | | 313/46 |
| 2012/0224378 A1* | 9/2012 | Koike ................ C09K 11/7774 |
| | | 362/259 |
| 2014/0003074 A1 | 1/2014 | Kishimoto |
| 2014/0168942 A1* | 6/2014 | Kishimoto ........... F21S 48/214 |
| | | 362/84 |
| 2014/0268787 A1* | 9/2014 | Nozaki .................. H01S 3/005 |
| | | 362/259 |

FOREIGN PATENT DOCUMENTS

| | | | |
|---|---|---|---|
| JP | 2008-021973 A | 1/2008 | |
| JP | 2008-027941 A | 2/2008 | |
| JP | 2008-076798 A | 4/2008 | |
| JP | 2008-258438 A | 10/2008 | |
| JP | 2009-272576 A | 11/2009 | |
| JP | 2010-199357 | * 9/2010 | ............ H01S 5/022 |
| JP | 2010-199357 A | 9/2010 | |
| JP | 2011-123368 A | 6/2011 | |
| JP | 2013-004480 A | 1/2013 | |

* cited by examiner

LIGHT EMITTING DEVICE

CROSS-REFERENCE TO RELATED APPLICATION

This application claims priority to Japanese Patent Application No. 2013-139674 filed on Jul. 3, 2013 and Japanese Patent Application No. 2013-241042 filed on Nov. 21, 2013 the disclosures of which are hereby incorporated by reference in their entireties.

BACKGROUND OF THE INVENTION

1. Field of the Invention

The present disclosure relates to a light emitting device comprising a laser diode and a wavelength converting member.

2. Background Art

A wavelength converting member generally comprises a binder such as glass, a resin, and the like, in which a fluorescent material is dispersed.

In the case of that glass is used as the binder for the wavelength converting member, the wavelength converting member can be secured to other member by, for example, heating, which allows the binder to be fused and bonded to the other member (see JP 2010-199357 A).

In the conventional light emitting devices, however, in a case where a high output power type laser diode is employed to increase output power of the light emitting device, the fluorescent material contained in the wavelength converting member may absorb a laser light and then release a heat.

Therefore, the binder surrounding the fluorescent material may be deformed or discolored.

Furthermore, there are possibilities that the binder may melt due to the heat generation from the fluorescent material, and thus the wavelength converting member may be fallen down from the light emitting device.

Herein, object of the present invention consists in a provision of a light emitting device which can employ a high output power type laser diode as a light source.

SUMMARY OF THE INVENTION

Disclosed herein is a light emitting device comprises
a laser diode;
a wavelength converting member which is configured to convert a wavelength of a light emitted from the laser diode; and
a support member which is configured to support the wavelength converting member so that the light passes through two surfaces of the wavelength converting member,
wherein:
the wavelength converting member comprises a fluorescent material and a binder,
at least one light transmissive member is disposed on at least one of the two surfaces of the wavelength converting member,
the binder has a melting point higher than a melting point of the light transmissive member,
the light transmissive member is fixed to the support member by fusion bonding.

The present invention can provide a light emitting device in which a high output power type laser diode can be employed.

DETAILED DESCRIPTION OF THE EMBODIMENTS

The light emitting device according to the present invention is described hereinafter with referring to the appended drawings.

The light emitting device according to the present invention includes, but is not limited to, the first to the sixth embodiments thereof, for example, which are described below.

First Embodiment

Figure 1:
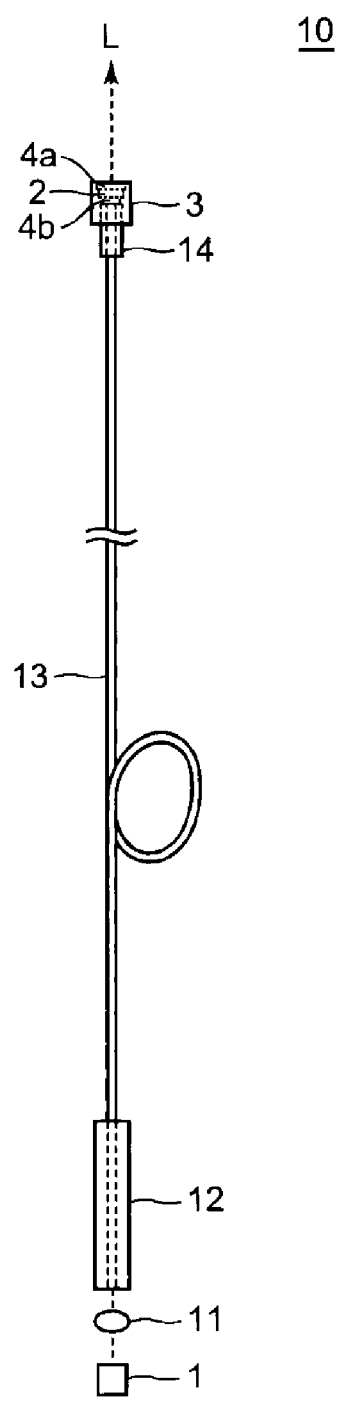
FIG. 1 is a schematic view showing a light emitting device according to an embodiment of the present invention as a general view.

FIG. 1 is a schematic view showing the light emitting device 10 according to the first embodiment of the present invention as a general view (hereinafter, which can be abbreviated as the "first light emitting device").

Figure 2:
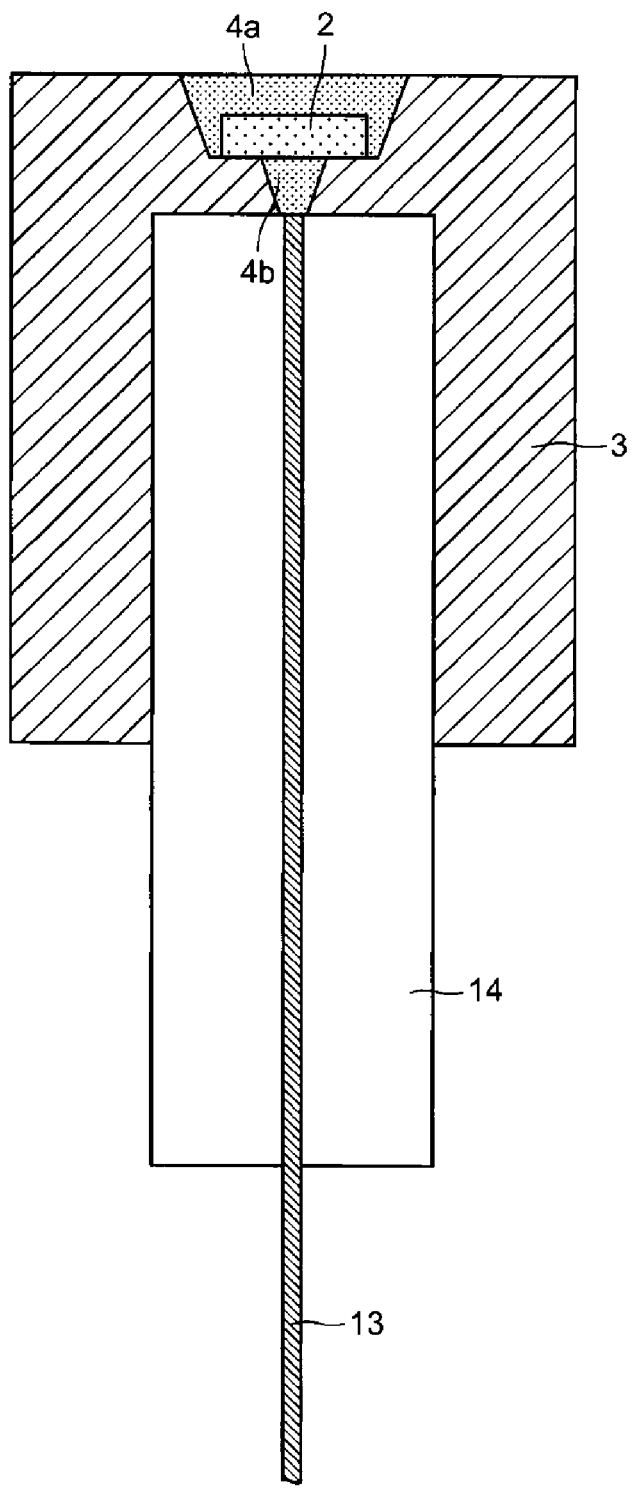
FIG. 2 is a cross-sectional schematic view of the terminal portion (particularly, components around the support member 3) of the light emitting device according to an embodiment of the present invention shown in FIG. 1.

FIG. 2 is a cross-sectional schematic view, which further illustrates the terminal portion (particularly, components around the support member 3) of the light emitting device 10 shown in FIG. 1 in detail.

Figure 3:
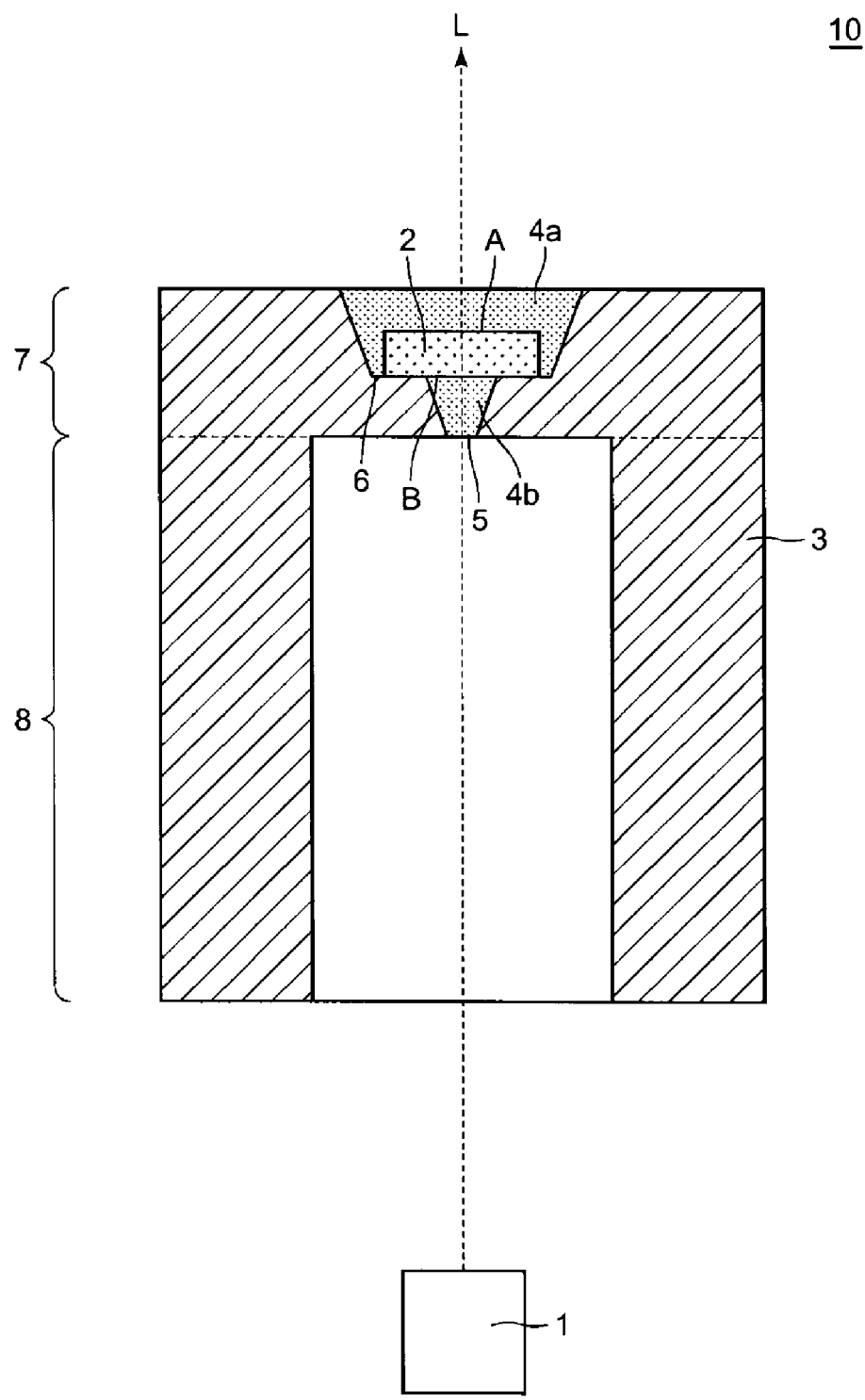
FIG. 3 is a cross-sectional schematic view of the light emitting device according to the first embodiment of the present invention.
Figure 4:
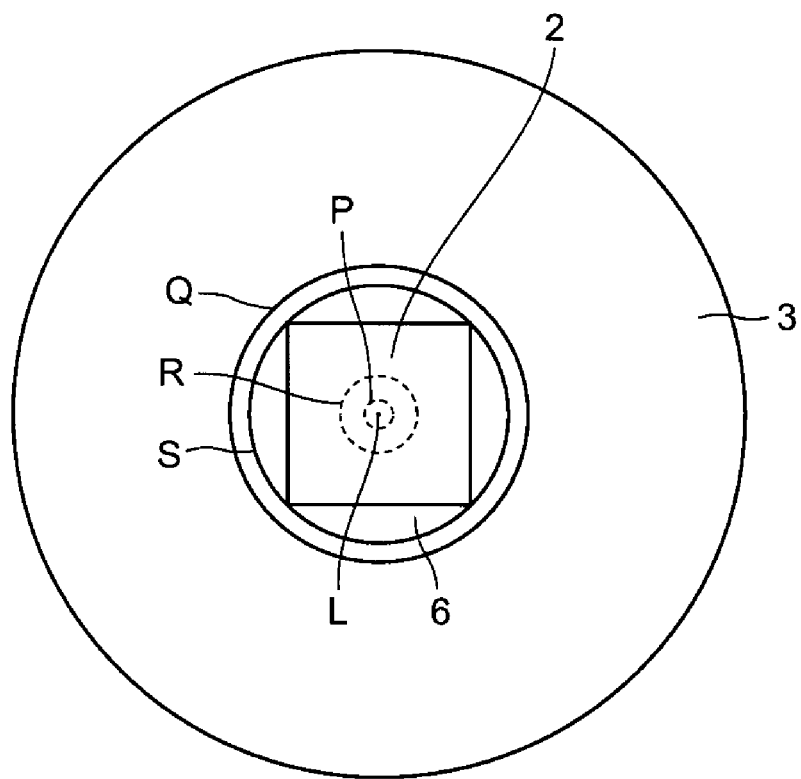
FIG. 4 is a top view of the light emitting device according to the first embodiment of the present invention.

Furthermore, FIG. 3 is a schematic view, which further illustrates in detail, as a cross-sectional schematic view, a relation between the wavelength converting member 2 and the support member 3 in the light emitting device 10 according to an embodiment of the present invention. FIG. 4 is a plan view of the light emitting device 10 shown in FIG. 3, which is illustrated from a view point above the device 10 (i.e., above a plane from which a light travels).

As it is illustrated in FIG. 1, FIG. 2 and FIG. 3, the light emitting device 10 according to the first embodiment of the present invention comprises:

a laser diode 1, which is configured to oscillate a laser light (hereinafter, the "laser diode" can be abbreviated as "LD");

a wavelength converting member 2, which is configured to convert a wavelength of the light emitted from the LD;

a support member 3, which is configured to support the wavelength converting member 2 such that the light emitted from the LD passes through two surfaces of the wavelength converting member 2 (e.g., in FIG. 3 which illustrates this embodiment in detail, these two surfaces include "surface A" (a surface of the wavelength converting member 2, which is opposed to the surface directed to the LD) and "surface B" (a surface of the wavelength converting member 2, which is directed to the LD), both of which are main surfaces of the member 2, in a pair, and faces each other).

Herein, the wavelength converting member 2 comprises a fluorescent material and a binder for holding the fluorescent material.

In this embodiment, as the binder contained in the wavelength converting member 2, a binder having a melting point higher than that of a light transmissive member 4a or 4b can be used (hereinafter, the light transmissive members 4a and 4b can be abbreviated collectively as a "light transmissive member 4").

Thus, in the case where a binder to be used herein has a relatively high melting point, the light transmissive member 4 can secure the wavelength converting member 2 to the support member 3.

In addition, in the case where the fluorescent material generates an elevated heat due to the LD with improved high output power, this embodiment can prevent from the deformation and discoloration of the binder, since the melting of the binder itself can be inhibited.

Although the light transmissive member has a melting point lower than that of the binder, the light transmissive member is placed apart from the fluorescent material.

Therefore, it can prevent the light transmissive member from its deformation due to the heat generation from the fluorescent material, etc.

Thus, according to the first embodiment of the present invention, heat resistance of the light emitting device can be improved. Accordingly, a light emitting device having a stable optical property can be provided.

Hereinafter, main components which can be employed in the light emitting device 10 are described in detail below.

Laser Diode

The laser diode 1 to be used in the first embodiment of the present invention (hereinafter, which is referred to as a "LD") can be any laser diode which can oscillate any laser light.

As the LD, a laser diode having an emission peak wavelength within a range, for example, from 300 nm to 500 nm, preferably from 400 nm to 470 nm, more preferably from 420 nm to 470 nm can be used. Typically, an edge emitting type LD can be employed herein.

A high output power type LD can be employed as the LD.

For example, an LD having output power from 1 W to 5 W as a single LD can be used.

Herein, a plurality of LDs can be employed herein to improve the total output power much higher than that in the case where the single LD is employed.

As it is described above, the light emitting device 10 according to the first embodiment of the present invention is particularly effective in the case of that the high output power type LD is employed, since the device has superior heat resistance property.

Herein, the number of the LD to be employed in one single light emitting device may be one, or two or more.

In the case of that no less than two LDs are employed, the ranges of the wavelengths may be in the same wavelength band, different from each other, or partially overlapped with each other.

Wavelength Converting Member

The wavelength converting member 2 includes a fluorescent material and a binder, and has a function converting the wavelength of the light emitted from the LD.

Thus, the light emitting device, typically, can combine the light emitted from the LD and the light having the wavelength converted by the wavelength converting member 2 (i.e., the light emitted from the fluorescent material), and then release out the combined light from this light emitting device.

Shape of the wavelength converting member 2 can be those having two surfaces through which the light emitted from the LD passes, and the shape is not particularly limited.

For example, as it is shown in FIG. 3, these two surfaces are faced or opposed to each other, each of which is planer (i.e., the wavelength converting member 2 is in a shape of a plate).

It may be in other shape, for example, in the shape wherein both of the surfaces are convex.

In the case of that the wavelength converting member 2 has a shape of a plate, for example, as it is shown in FIG. 3, it is preferable that these two surfaces (i.e., "surface A" and "surface B" of FIG. 3) are positioned in parallel to each other, through which the light emitted from the LD passes.

It is also preferable that each of the surfaces A and B of the wavelength converting member 2 is positioned perpendicularly to the axis which is in a direction along the traveling direction of the light emitted from the LD (i.e., "optical axis L"). Although, in FIG. 3, the optical axis L is illustrated in a linear line for convenience, an optical fiber 13 as it is shown in FIG. 1 can propagate therethrough the light emitted from the LD to the wavelength converting member 2 in this embodiment.

Therefore, spatial relation between the LD and the wavelength converting member 2 can be optionally determined, and which is not limited to the relation that the LD and the wavelength converting member 2 are arranged in a straight line as it is shown in FIG. 3.

The shapes of the surfaces A and B of the wavelength converting member 2 from the view point above these two surfaces (or above the plane from which the light travels) are not particularly limited.

The shapes can be, for example, circles and polygons such as triangular and rectangular shapes, etc.

The shape can be optionally or appropriately selected or determined depending on any application and object of the light emitting device.

Herein, dimensions (or areas) of the surfaces A and B in the wavelength converting member 2 may be identical or different from each other.

As it is illustrated in FIG. 4 as a plan view from a view point above the light emitting device 10, the light emitting device 10 has the wavelength converting member 2 in a rectangular shape, preferably a square shape, wherein the dimensions of the surfaces A and B are identical.

The fluorescent material to be contained in the wavelength converting member 2 is not particularly limited.

For example, a fluorescent material which can emit a yellow light can be used in the case of that the LD to be employed herein is that oscillates a blue light.

Thus, it is possible to provide a white light by a combination of the light emitted from the LD and the light released from the fluorescent material.

Certainly, the light emitted from the LD can be an ultraviolet light. In such a case, for example, three fluorescent materials emitting a red light, a blue light and a green light respectively can be employed in order to provide a white light by a combination of these three colored lights released from these three fluorescent materials, respectively.

The fluorescent material includes, for example, a yttrium-aluminium-garnet based fluorescent material (hereinafter, which can be referred to as a "YAG type fluorescent material"), a lutetium-aluminium-garnet based fluorescent material (hereinafter, which can be referred to as a "LAG type fluorescent material"), a terbium-aluminium-garnet based fluorescent material (hereinafter, which can be referred to as a "TAG type fluorescent material"), and the like.

The fluorescent material can be employed herein alone or in a combination.

An amount of the fluorescent material to be contained in the wavelength converting member 2 is not particularly limited.

For example, it can be within a range from 0.05% to 50%, preferably from 1% to 15% by weight relative to the total weight of the wavelength converting member 2.

In the case of that the amount is no less than 0.05% by weight, the fluorescent material can convert the light emitted from the LD sufficiently.

In the case of that the amount is no more than 50% by weight, amount of the heat resulted from the fluorescent material can be reduced.

The binder to be contained in the wavelength converting member 2 is not particularly limited.

It is, however, important that the binder is selected to have a melting point higher than that of the light transmissive member as it is described above.

Thus, selecting the binder having such a melting point can prevent the binder itself from melting, and prevent the binder from deforming and/or discoloring, even if the fluorescent material generates heat at high temperature due to the high output power of the LD.

Furthermore, as the binder having a thermal conductivity superior to that of the light transmissive member 4 is employed herein, the heat generated from the fluorescent material with the higher output power of the LD can be successfully dissipated therefrom since the binder can efficiently conduct the heat from the fluorescent material.

Herein, the difference between the melting point of the binder to be contained in the wavelength converting member 2 and the melting point of the light transmissive member 4 can be adjusted within a range from 500° C. to 2500° C., preferably from 800° C. to 1500° C.

In the case of that the difference between these melting points is no less than 500° C., the deformation of the binder to be occurred prior to the deformation of the light transmissive member 4 can be prevented.

In the case of that the difference between the melting points is no more than 2500° C., the binder and the light transmissive member 4 can be optionally and appropriately selected.

The melting point of the binder is generally within a range from 1000° C. to 3000° C., preferably from 1300° C. to 2500° C., more preferably from 1500° C. to 2000° C.

In the case of that the melting point of the binder is no less than 1000° C., the deformation of the binder can be prevented during the step such as the fusion bonding of the light transmissive member to the support member, and the light transmissive member having a relatively higher melting point can be selected.

In the case of that the melting point of the binder is no more than 3000° C., the step, for example, formation of the binder by sintering is facilitated, and therefore, the wavelength converting member with an improved certain quality can be produced.

The binder to be contained in the wavelength converting member 2 can be made of, for example, aluminium oxide ($Al_2O_3$, melting point: about 1900° C. to 2100° C.), silicon dioxide ($SiO_2$, melting point: about 1500° C. to 1700° C.), zirconium oxide ($ZrO_2$, melting point: about 2600° C. to 2800° C.), barium oxide (BaO, melting point: 1800° C. to 2000° C.), titanium oxide ($TiO_2$, melting point: 1700° C. to 1900° C.), etc.

Among these, aluminium oxide and silicon dioxide are preferable, and use of the aluminium oxide is particularly preferable because of its melting point, thermal conductivity, diffusibility, etc.

In the present invention, the binder can be composed of one single material, or in a combination of two or more materials.

Herein, in the case of that the binder is composed of two or more materials, the melting point of the binder to be compared to the melting point of the light transmissive member 4 is defined as the lowest melting point among those of the materials.

Herein, the wavelength converting member 2 may optionally comprise a light scattering member.

The light scattering member can be those having a melting point higher than that of the binder contained in the wavelength converting member 2 and having a refractive index different from that of the binder.

Depending on the material to form the binder, the light scattering member can be made of, for example, aluminium oxide, silicon oxide, titanium oxide, etc.

Amount of the light scattering member can be smaller than that of the binder to be employed.

Furthermore, any layer such as an antireflection layer (AR layer) can be optionally disposed on the surface of the wavelength converting member 2 (on the surface directed to the LD, the surface opposed to the surface directed to the LD, or on both of these surfaces).

Herein, a plurality of wavelength converting members 2 may be employed in this embodiment.

These wavelength converting members 2 may be identical or different from each other.

According to the first embodiment of the present invention, the wavelength converting member 2 can be prepared by mixing the fluorescent material, the binder, and other optional material such as the light scattering member, and forming the mixture to give a shape having a desired dimension and configuration according to the conventionally known method such as sintering.

Light Transmissive Member

The light transmissive member 4 can transmit, therethrough, a light emitted from a light source, and the light transmissive member 4 can be fixed to the support member 3 by fusion bonding.

Optionally, the light transmissive member 4 can at least partially cover the above-described wavelength converting member 2.

For example, as it is illustrated in FIG. 3, two light transmissive members 4a and 4b are disposed on both of the light-transmitting surfaces A and B of the wavelength converting member 2, respectively.

Such light transmissive member 4 plays a role which can assist the fixing of the wavelength converting member 2 to the support member 3.

It is preferable that the light transmissive member 4 is fused and bonded to a region in the through-hole 5 of the support member 3 predominantly on which the wavelength converting member 2 is not presented, particularly on an inner wall of the through-hole 5 of the support member 3, which is described hereinafter in detail.

Further, it is more preferable that the light transmissive member 4 is also fused and bonded to the light-transmissive surfaces A and/or B of the wavelength converting member 2. It is also preferable that the wavelength converting member 2 which is described hereinafter in detail is not bonded, by its fusion bonding, to the support member 3.

Herein, a conventional general procedure can be employed to bond the wavelength converting member 2 to the support member 3.

For example, the side surface of the wavelength converting member 2 and the inner wall of the through-hole 5 of the support member 3 can be bonded by a fusion bonding with a low melting glass, etc.

In such a case, however, there may be a problem that the positioning of the low melting glass on the support member 3 may be difficult thereon, and the fusion bonding between them may not be performed with a good reproducibility.

Furthermore, there may be an additional problem that it may be difficult to obtain a sufficient strength of the fusion bonding even in the case where the low melting glass can be accurately positioned on the support member 3 and the wavelength converting member 2 can be bonded to the support member 3, due to the area of the side surface of the wavelength converting member 2 is limited.

Herein, in this embodiment, the light transmissive member 4a can be disposed on the surface A of the wavelength converting member 2 as it is illustrated in FIG. 3 in detail.

After that, the light transmissive member 4b can be disposed on the surface B of the wavelength converting member 2.

Subsequently, the light transmissive members 4a and 4b can be fixed to the support member 3, particularly to the inner wall of the through-hole 5 of the support member 3 by fusion bonding, respectively, in order to fix the wavelength converting member 2 to the support member 3.

Placing the light transmissive members 4a and 4b on the both surfaces of the wavelength converting member 2 allows the wavelength converting member 2 to be fixed more tightly to the support member 3.

Furthermore, in this embodiment, through both of the light transmissive members 4a and 4b, the heat can be conducted to the support member 3 and dissipated therefrom.

Therefore, the heat dissipation from the light emitting device can be further improved.

The light transmissive member 4a and/or 4b may have a refractive index lower than that of the wavelength converting member 2.

For example, in the case of that the refractive index of the light transmissive member 4a is lower than the refractive index of the wavelength converting member 2, the extraction efficiency of the light extracted from the light transmissive member 4a can be improved.

In the case of that the refractive index of the light transmissive member 4b is lower than the refractive index of the wavelength converting member 2, the incident efficiency of the light entering into the light transmissive member 4b can be improved.

The materials to form the light transmissive members 4a and 4b can be those allowing the resulting light transmissive members 4a and 4b to be bonded to the support member 3 by their fusion bonding, respectively.

In the first embodiment of the present invention, it is important to appropriately select the material such that the melting points of the light transmissive members 4a and 4b are respectively lower than the melting point of the binder to be contained in the wavelength converting member 2 as it is described above.

The melting point of the light transmissive member can be adjusted within a range of generally from 200° C. to 1000° C., preferably from 500° C. to 900° C.

In the case of that the melting point is no less than 200° C., some properties such as heat resistance, weather resistance and transmittance of the light transmissive member can be improved.

In the case of that the melting point is no more than 1000° C., the fusion bonding of the light transmissive member to the support member can be facilitated, and therefore, the productivity of this light emitting device can be improved.

Herein, the melting point of the light transmissive member means a temperature at which softening of the light transmissive member starts with increasing the temperature.

Herein, in the embodiments of the present invention, the melting point of the light transmissive member is defined as the softening point of the main material to form the light transmissive member.

The main material to form the light transmissive member can be glass such as soda glass (or soda lime glass), borosilicate glass, lead glass, which are given with preference.

Generally, soda glass means glass comprising silicon dioxide ($SiO_2$), sodium oxide ($Na_2O$) and/or potassium oxide ($K_2O$) as main ingredients. In the first embodiment of the present invention, a conventional soda glass can be used.

Softening point of the soda glass is generally within a range from 500° C. to 800° C., preferably from 600° C. to 800° C.

Generally, the borosilicate glass can be glass comprising silicon dioxide ($SiO_2$) as a main ingredient, and other additional ingredient(s) such as boron oxide (boric anhydride) ($B_2O_3$).

In the first embodiment of the present invention, the conventional borosilicate glass can be used.

Softening point of the borosilicate glass is generally within a range from 500° C. to 1000° C., preferably from 500° C. to 900° C.

Generally, the lead glass means glass comprising silicon dioxide ($SiO_2$) and lead oxide (PbO) as main ingredients.

In the first embodiment of the present invention, the conventional lead glass can be used.

Softening point of the lead glass is generally within a range from 300° C. to 600° C., preferably from 500° C. to 600° C.

It is preferable to use the borosilicate glass because of its light resistance, weather resistance, transmittance, etc.

Herein, in the case of that the wavelength converting member 2 contains the light scattering member, as it is described above, a reaction between the light scattering member and the binder is occurred during the formation of the wavelength converting member 2, and therefore, there is a possibility that the transmittance may be deteriorated.

As it is mentioned above, the wavelength converting member 2 contains a given amount of the fluorescent material.

Therefore, the content of the light scattering member is limited.

Herein, in this embodiment, the light transmissive member 4 can contain the light scattering member while the wavelength converting member 2 contains no light scattering member.

In such a case, local deterioration of the transmittance in the wavelength converting member 2 can be prevented, and the light transmissive member 4 can contain the light scattering member in a relatively large amount.

For example, in the case of that the light transmissive member 4a illustrated in FIG. 3 contains the light scattering member, the light can be extracted therefrom in a state of that the light is scattered and thus the light can obtain a desired orientation.

In the case of the light transmissive member 4b illustrated in FIG. 3 contains the light scattering member, the light in a state of that the density of the light is lowered can illuminate the fluorescent material. Thus, the heat to be generated from the fluorescent material can be reduced and color unevenness of the extracting light can be improved.

The material of the light scattering member to be contained in the light transmissive member 4 is not particularly limited. For example, silicon oxide, titanium oxide or the like can be used.

Herein, the amount of the light scattering member to be contained in the light transmissive member 4 is not particularly limited.

Herein, optionally, the light transmissive member 4 may contain the fluorescent material in an amount smaller than that of the fluorescent material contained in the wavelength converting member 2 in order to correct the color quality of the light entering into the wavelength converting member 2 and/or the light extracting from the wavelength converting member 2 to obtain the desired color quality.

The fluorescent material may include, but is not particularly limited to, for example, red fluorescent materials, etc.

In this embodiment, the light transmissive member 4 can be prepared by mixing the material(s) such as those to form the above-described glass, and optional other material(s) such as those to form the light scattering member, and forming the mixture into the desired shape and dimension.

The light transmissive member 4 can be fixed to the support member 3 by, for example, appropriately positioning the light transmissive member 4 together with the wavelength converting member 2 to the support member 3, and heating them as a whole to fuse and bond the light transmissive member 4 to the support member 3.

Herein, the light transmissive member 4 and the wavelength converting member 2 may be fixed each other by such fusion bonding. At that time, it is preferable to select the temperature and pressure such that the light transmissive member 4 is melted while the binder in the wavelength converting member 2 is not melted.

Thereby, without the wavelength converting member 2 being melted, the light transmissive member 4 can be bonded and fixed to the support member 3 by the fusion bonding in order to secure the wavelength converting member 2 to the support member 3.

Support Member

As it is illustrated in FIG. 3, the support member 3 has a through-hole 5 extending along a traveling direction of a light such that a light emitted from the LD passes through the hole.

The support member 3 can physically support the wavelength converting member 2 on the inner wall of the through-hole 5.

As used herein, with respect to the support member 3, the expression the "through-hole 5 extending along with a traveling direction of a light" is defined as that the diameter of the through-hole 5 is getting larger along with the traveling direction of the light in the first embodiment of the present invention.

The support member 3 comprises:
- a base portion 7 having a through-hole 5 formed approximately coaxially to the optical axis L, with the base portion being in the shape of a disk; and
- a sleeve portion 8 supporting the bottom surface of the base portion 7 (its surface directed to the LD) at its periphery, which portion is in the shape of a cylinder.

It is preferable that the base portion 7 and the sleeve portion 8 are formed together integrally in this embodiment.

In this embodiment, the inner wall of the through-hole 5 created in the base portion 7 of the support member 3 has a tapered surface extending along with the traveling direction of the light.

Accordingly, on such tapered surface, the attached area between the support member 3 and the light transmissive members 4a and 4b is increased, and the therefore, the bonding strength by the fusion bonding is increased.

Additionally, the tapered surface can prevent the light from going backward to the LD.

In this embodiment, the angle of the tapered surface is not particularly limited, and optionally, depending on the desired application, it can be appropriately determined.

On the inner wall of the through-hole 5, the tapered surface is not provided on all the inner surface, as it is illustrated in FIG. 3. On this inner surface, a stage 6 can be provided to support the wavelength converting member 2 thereon.

The stage 6 has a plane perpendicular to the optical axis L, which can facilitate the positioning of the wavelength converting member 2 on the support member 3.

Providing the stage 6 relatively facilitates that the light transmissive members 4a and 4b are fused and bonded to the inner wall of the through-hole 5.

In addition, FIG. 4 is a plan view of the light emitting device 10 which is illustrated in FIG. 3 from an upper view point (i.e., a view point above the surface A of the wavelength converting member 2).

It is preferable that an aperture P of the through-hole 5 directing to the LD, an aperture Q of the through-hole 5 opposed to the LD, an aperture R provided on the stage 6, and a periphery S which is the peripheral portion of the stage 6 are extended concentrically about the optical axis L, as it is shown in FIG. 4.

Herein, the configuration of each of the apertures P, Q and R as well as the periphery S can be, but is not limited to, a circle illustrated in FIG. 4.

Placing the wavelength converting member 2 on the stage 6 can increase the contacting area between the wavelength converting member 2 and the support member 3 (particularly the stage 6) with comparative easiness. Thereby, a heat dissipation route from the wavelength converting member 2 to the support member 3 can be ensured, and therefore, the light emitting device having further excellent heat dissipation and heat resistance can be obtained.

The light transmissive member 4a can be configured to partially contact with the support member 3 on the stage 6, as it is illustrated in FIG. 3.

Thereby, the contacting area between the light transmissive member 4a and the support member 3 can be increased with a comparative easiness. Accordingly, the light transmissive member 4a can be fixed more tightly to the support member 3 by fusion bonding.

The material to form the base portion 7 and/or the sleeve portion 8 of the support member 3 is not particularly limited, but those having a thermal expansion coefficient similar to that of the light transmissive member 4 are preferable.

Besides, the material having an excellent radiation property is preferable.

Such material can be, typically, a metal (e.g., iron, nickel, cobalt, aluminium) and alloy thereof (e.g., stainless steel, Ni—Fe alloy, Kovar), etc.

Among these, it is preferable to use Kovar or aluminium because of its thermal expansion coefficient.

Herein, a reflective coat comprising a material including silver can be applied on the support member 3, particularly on the surface of the inner wall of the through-hole 5.

Therefore, the extract efficiency of the light can be further improved.

The support member 3 can be prepared form the above-described material according to the conventionally known method (e.g., press processing, machining, or the like).

Other Components

Herein, in the first embodiment of the light emitting device 10 according to the present invention, an optical fiber 13 can be provided between the LD and the wavelength converting member 2, as it is illustrated in FIG. 1.

Thereby, the light emitted from the LD can be radiated through the optical fiber 13 to the wavelength converting member 2 in order to illuminate the wavelength converting member 2.

Therefore, the relative positional relation between them can be comparatively and optionally designed.

The optical fiber 13 can be composed of a material including, for example, glass, preferably quartz glass, resin, etc.

Furthermore, as shown in FIG. 2, one end portion of the optical fiber 13 (i.e., an end of the optical fiber 13, which is a side directed to the wavelength converting member 2) may have an adaptor 14 to be engaged and connected to the inner space of the sleeve portion of the support member 3.

Another end portion of the optical fiber 13 (i.e., an end of the side directed to the LD) may have a connector 12 to facilitate the connection between the optical fiber 13 and the LD or a device comprising the LD, as it is illustrated in FIG. 1.

Furthermore, regarding the end face of the optical fiber 13, which is directed to the LD, a lens 11 may be provided between the end face of the optical fiber 13, which is directed to the LD, and the LD, in order to collect the light emitted from the LD, as it is illustrated in FIG. 1.

The lens 11 can be that enabling the light emitted from the LD to be collected on the end face of the optical fiber 13.

Herein, the light emitting device according to the first embodiment of the present invention is configured as it is described above, but the light emitting device according to the present invention is not particularly limited to the configuration of this first embodiment.

Second Embodiment

The light emitting device 20 according to the second embodiment of the present invention is similar to the device illustrated in FIG. 1 except the configurations around the support member 3.

Figure 5:
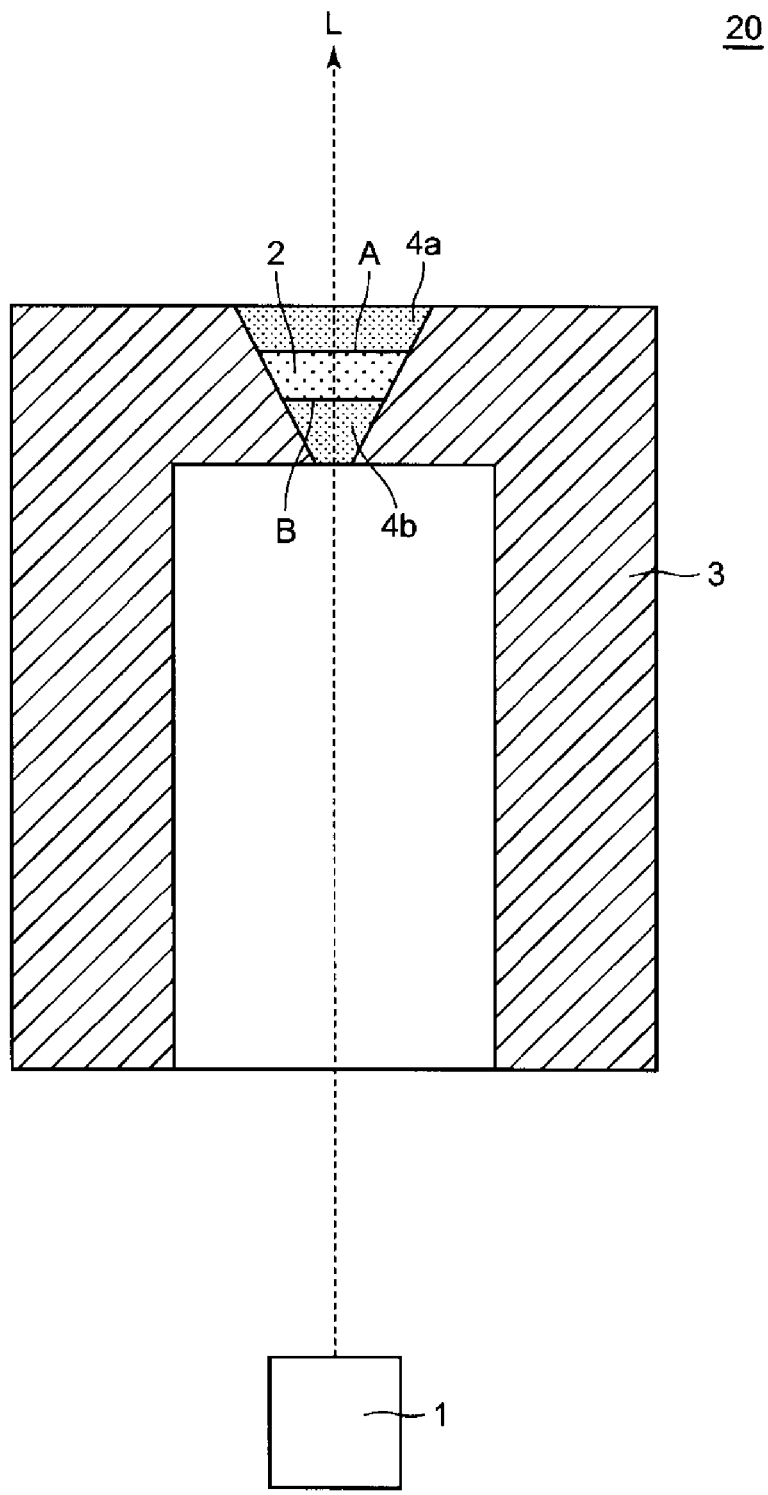
FIG. 5 is a cross-sectional schematic view of the light emitting device according to the second embodiment of the present invention.

Specifically, as it is illustrated in FIG. 5, the shape of each of the wavelength converting member 2, the support member 3 and the light transmissive members 4a and 4b is different from that of the first embodiment shown in FIG. 3.

In the embodiment shown in FIG. 5, any stage 6 as it is illustrated with respect to the first embodiment shown in FIG. 3 is not provided on the inside of the through-hole of the support member 3, but a tapered surface is provided on all the inner area.

Other configurations are similar to those described in the first light emitting device.

In this second embodiment, providing the tapered surface on all the area of the inner wall of the through-hole 5 can increase the attached area by the fusion bonding between the light transmissive members 4a and 4b and the support member 3, and thus the wavelength converting member 2 can be fixed more tightly thereto.

Herein, such tapered surface can prevent the light from going backward. The angle of the created taper surface is not particularly limited, and optionally, depending on the desired application, it can be appropriately determined.

Herein, dimensions and shapes of the wavelength converting members 2 as well as the light transmissive members 4a and 4b can be adjusted corresponding to the shape of the tapered surface.

In the second light emitting device, it is preferable that the wavelength converting member 2 as well as the light transmissive members 4a and 4b are positioned coaxially about the optical axis L.

Figure 6:
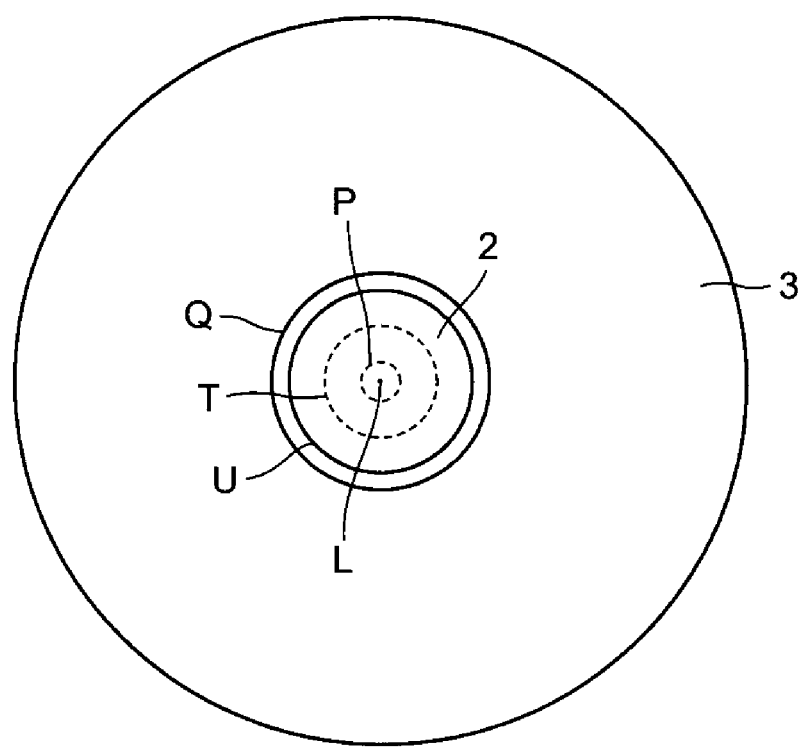
FIG. 6 is a top view of the light emitting device according to the second embodiment of the present invention.

For example, as it is illustrated in the top view of FIG. 6, it is preferable that an aperture P of the through-hole provided in the support member 3, which is directed to the LD; an aperture Q of the through-hole provided in the support member 3, which is opposed to the LD; a periphery T of the wavelength converting member 2, which is directed to the LD; and a periphery U of the wavelength converting member 2, which is opposed to the LD; have any shapes and dimensions, respectively, such that these are extended concentrically about the optical axis L.

It is preferable that the periphery of the light-entering side of the light transmissive member 4a approximately corresponds to the periphery U of the light-extracting side of the wavelength converting member 2, and these peripheries preferably have substantially the same shape and dimension.

It is preferable that the periphery of the light-extracting side of the light transmissive member 4a approximately corresponds to the aperture Q of light-extracting side of the through-hole provided in the support member 3, and these preferably have substantially the same shape and dimension.

It is preferable that the periphery of the light-entering side of the light transmissive member 4b approximately corresponds to the aperture P of the light-entering side of the through-hole provided in the support member 3, and these preferably have substantially the same shape and dimension.

It is preferable that the periphery of the light-extracting side of the light transmissive member 4b approximately corresponds to the periphery T of the light-entering side of the wavelength converting member 2, and these preferably have substantially the same shape and dimension.

Third Embodiment

The light emitting device 30 according to the third embodiment of the present invention is similar to that of the light emitting device shown in FIG. 1 as a whole.

Figure 7:
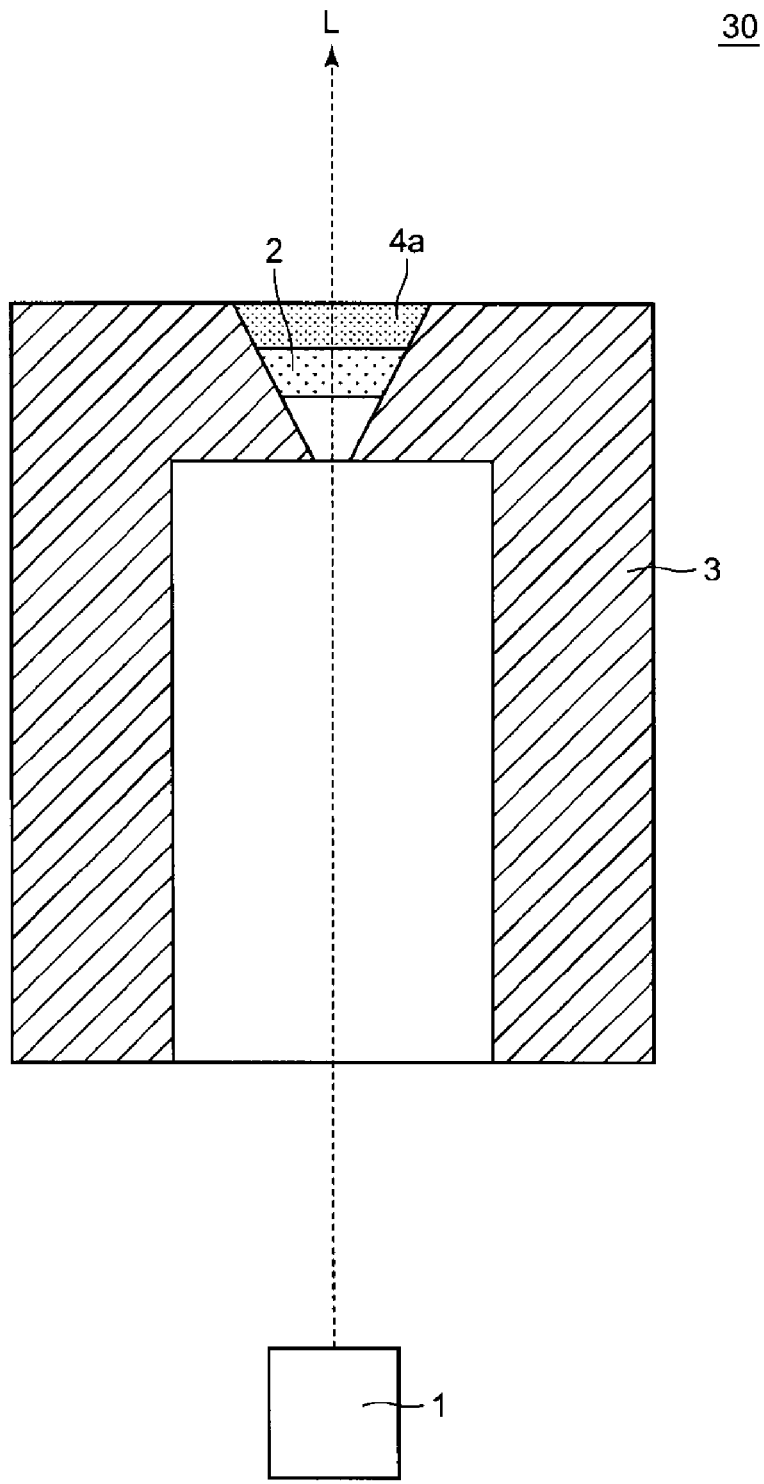
FIG. 7 is a cross-sectional schematic view of the light emitting device according to the third embodiment of the present invention.

Specifically, as it is illustrated in FIG. 7, the shapes of the wavelength converting member 2, the support member 3, and the light transmissive member 4a are respectively different from those of the first embodiment shown in FIG. 3.

In the embodiment illustrated in FIG. 7, the whole inner wall of the through-hole provided in the support member 3 has a tapered surface without the stage 6 provided in the first embodiment shown in FIG. 3.

Furthermore, in this embodiment, the light transmissive member 4b which can be employed in the first embodiment is not provided, but only the light transmissive member 4a is placed.

Other configurations are similar to those of the above-described light emitting device of the first embodiment.

Herein, the wavelength converting member 2, the support member 3 and the light transmissive member 4a, which are illustrated in FIG. 7, may have substantially same shapes to those illustrated in FIG. 5 and FIG. 6.

Herein, the dimensions may be identical or different from those illustrated in FIG. 5 and FIG. 6.

Such configurations enable the light transmissive member 4a to fix the wavelength converting member 2 to the support member 3.

In this embodiment, output power can be further improved since the light emitted from the LD directly irradiates the wavelength converting member 2 although color unevenness may be occurred as the light transmissive member 4b is not provided.

In this embodiment, at an area where the light transmissive member 4b is not provided in the through-hole, the wavelength converting member 2 could not be fallen down from the through-hole to the downward since the through-hole is tapered and narrowed toward the LD.

Fourth Embodiment

The light emitting device 40 according to the fourth embodiment of the present invention is similar to that of the light emitting device shown in FIG. 1 as a whole.

Figure 8:
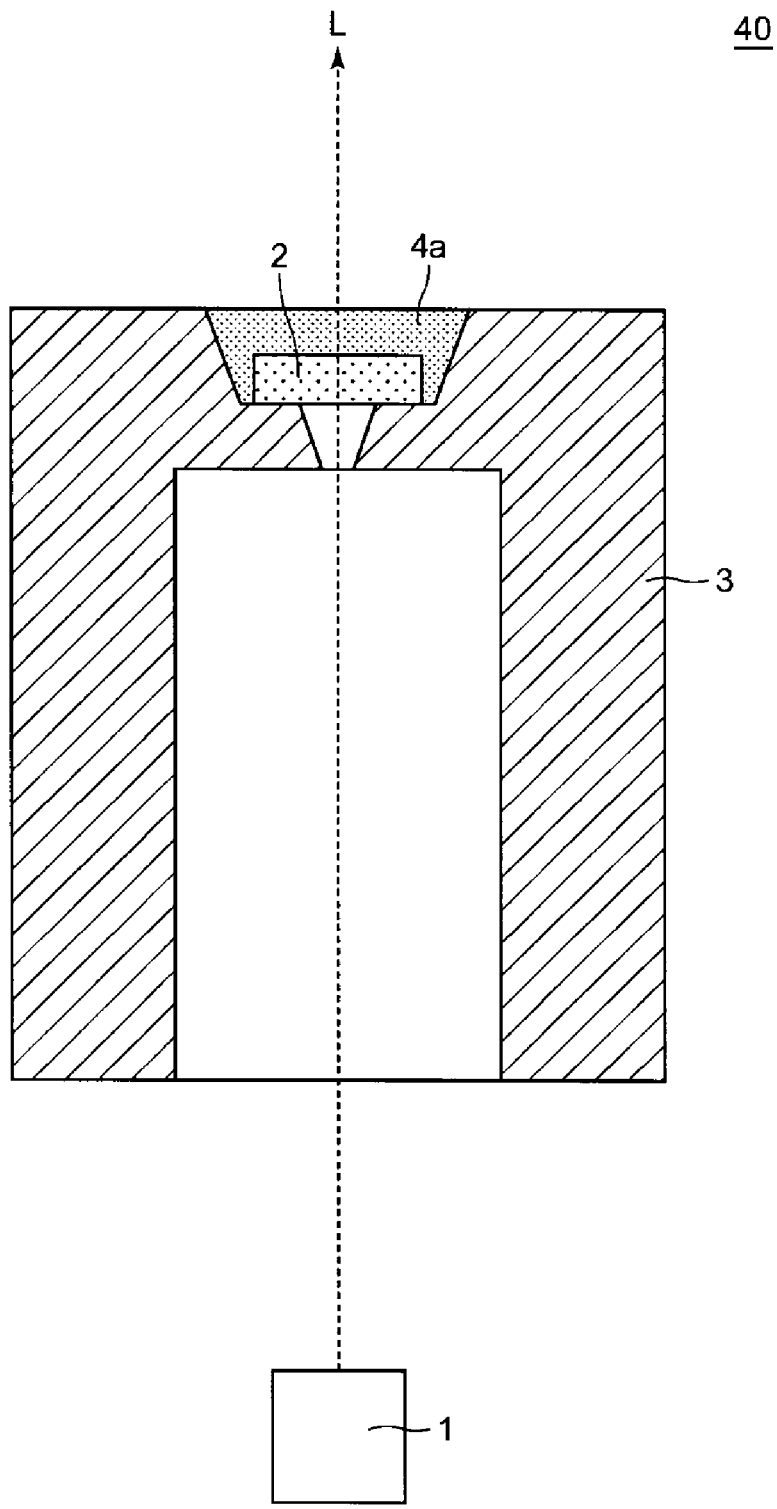
FIG. 8 is a cross-sectional schematic view of the light emitting device according to the fourth embodiment of the present invention.

Specifically, as it is illustrated in FIG. 8, the light transmissive member 4b which can be employed in the first embodiment shown in FIG. 3 is not provided, but only the light transmissive member 4a is provided as the light transmissive member.

Other configurations are similar to those of the above-described light emitting device according to the first embodiment.

Such configurations enable the light transmissive member 4a to fix the wavelength converting member 2 to the support member 3.

Herein, at the area where the light transmissive member 4b is not presented in the through-hole, the through-hole is narrowed. Therefore, the wavelength converting member 2 could not be fallen down from the through-hole at that lower area.

Fifth Embodiment

The light emitting device 50 according to the fifth embodiment of the present invention is similar to that of the light emitting device shown in FIG. 1 as a whole.

Figure 9:
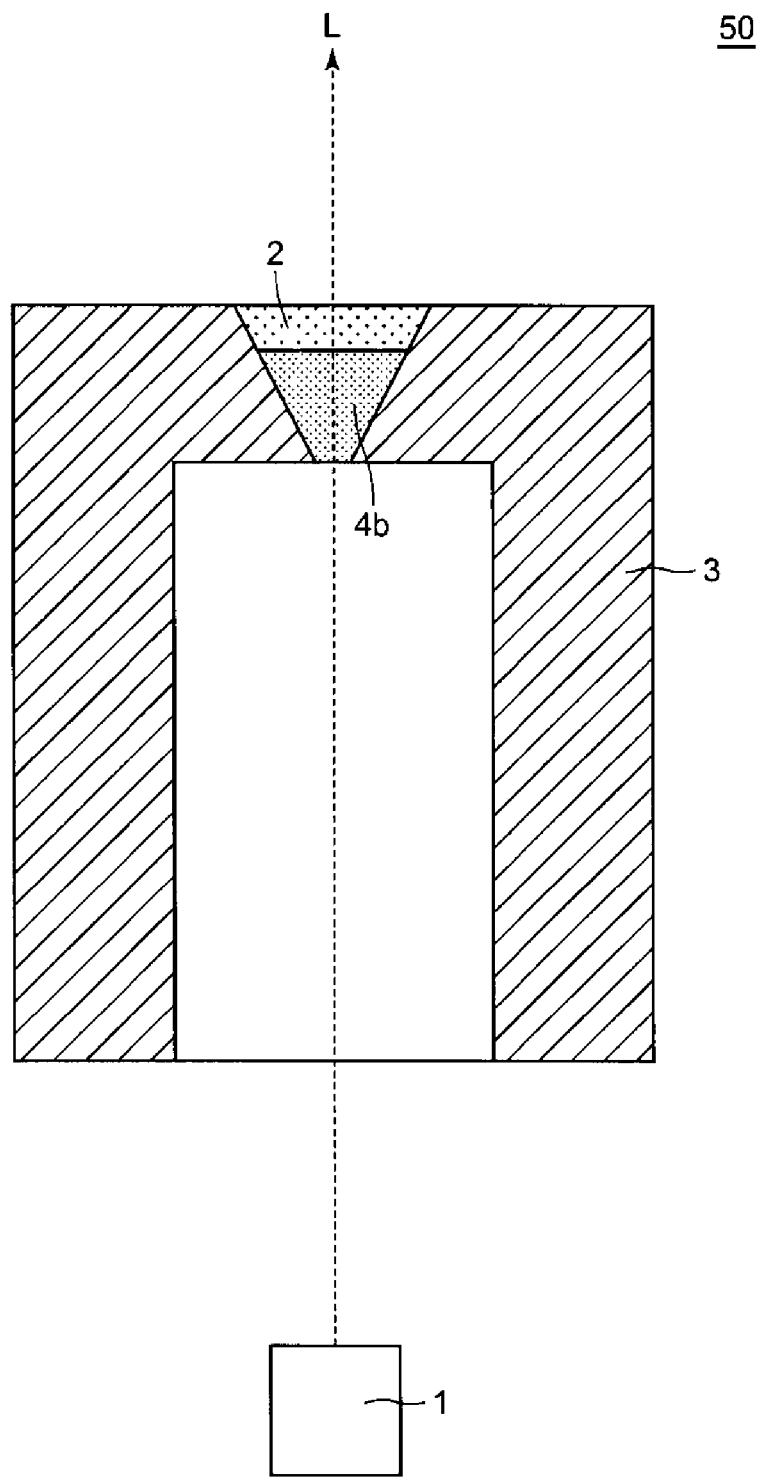
FIG. 9 is a cross-sectional schematic view of the light emitting device according to the fifth embodiment of the present invention.

However, specifically, as it is illustrated in FIG. 9, the shapes of the wavelength converting member 2, the support member 3 and the light transmissive member 4b are respectively different from those of the first embodiment shown in FIG. 3.

Besides, in the embodiment illustrated in FIG. 9, the whole inner wall of the through-hole of the support member 3 has a tapered surface without the stage 6 provided in the first embodiment shown in FIG. 3.

Furthermore, in this embodiment, the light transmissive member 4a which can be employed in the first embodiment illustrated in FIG. 3 is not provided, and therefore, the surface A of the wavelength converting member 2 is the light emitting surface.

Additionally, only the light transmissive member 4b is provided as the light transmissive member.

Other configurations are similar to those of the above-described light emitting device according to the first embodiment.

Herein, the wavelength converting member 2, the support member 3, and the light transmissive member 4b, which are illustrated in FIG. 9, respectively, may have the same shapes to those illustrated in FIG. 5 and FIG. 6.

Herein, the dimensions may be identical or different from those illustrated in FIG. 5 and FIG. 6.

Such configurations enable the light transmissive member 4b to fix the wavelength converting member 2 to the support member 3.

In such a case, the light transmissive member 4b and the wavelength converting member 2 are fixed to each other by the fusion bonding of the light transmissive member 4b.

Sixth Embodiment

The light emitting device 60 according to the sixth embodiment of the present invention is similar to that of the light emitting device shown in FIG. 1 as a whole.

Figure 10:
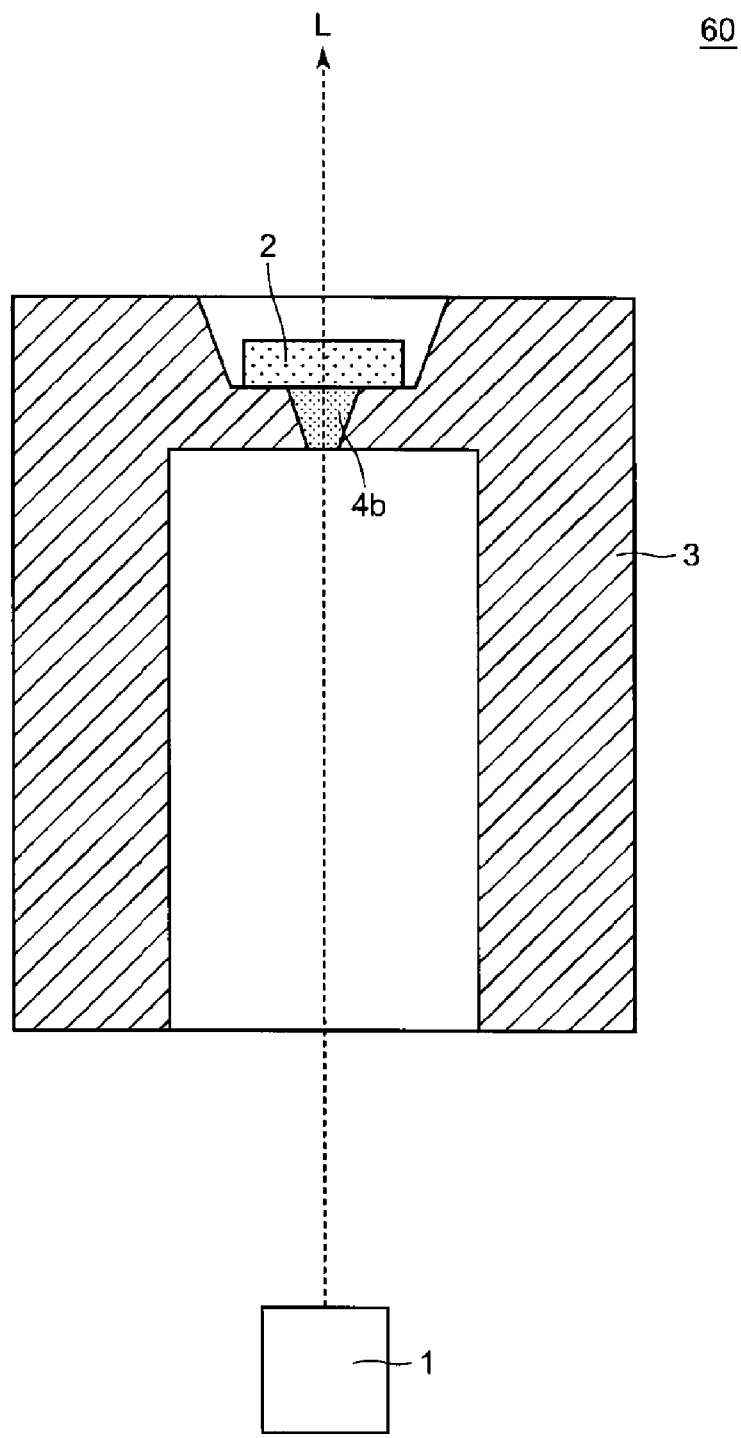
FIG. 10 is a cross-sectional schematic view of the light emitting device according to the sixth embodiment of the present invention.

However, specifically, as it is illustrated in FIG. 10, the light transmissive member 4a which can be employed in the first embodiment shown in FIG. 3 is not provided, and therefore, the surface A of the wavelength converting member 2 is the light emitting surface.

Additionally, only the light transmissive member 4b is provided as the light transmissive member.

Other configurations are similar to those of the above-described light emitting device according to the first embodiment.

Such configurations enable the light transmissive member 4b to fix the wavelength converting member 2 to the support member 3.

In such a case, the light transmissive member 4b and the wavelength converting member 2 are fixed to each other by the fusion bonding of the light transmissive member 4b.

Other Embodiments

Figure 11:
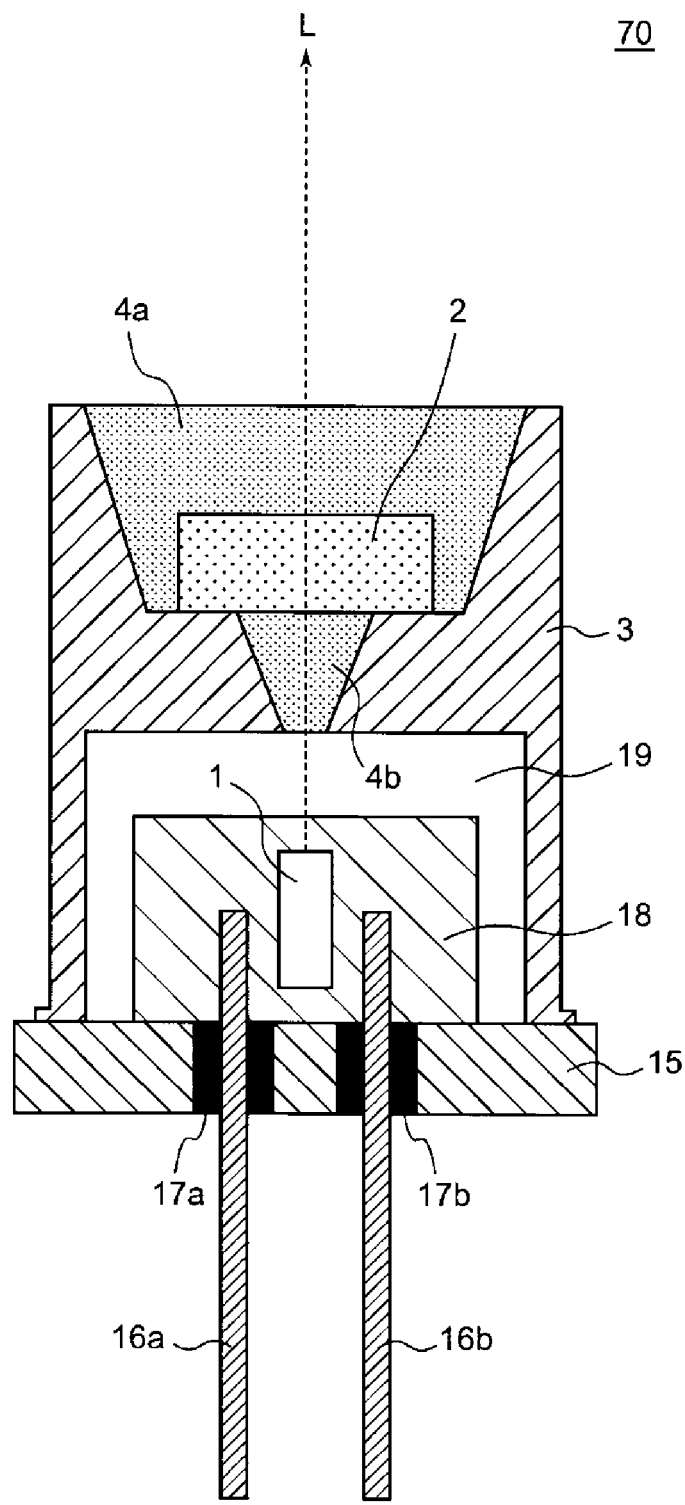
FIG. 11 is a cross-sectional schematic view showing of the light emitting device according to the other embodiment the present invention.

FIG. 11 illustrates a cross-sectional schematic view for describing the configurations of the light emitting device 70 according to the one of the other embodiments of the present invention.

As it is described in FIG. 11, the components such as the lens 11, the connector 12, the optical fiber 13 and the adaptor 14 which can be employed in the above-described embodiment are not provided between the laser diode 1 and the wavelength converting member 2.

The laser diode 1 is provided in the inner space 19 inside the sleeve portion 8 of the support member 3.

Other components and configurations thereof are substantially similar to those of the light emitting devices described in the above-described first to sixth embodiments.

In this embodiment, the laser diode 1 can be fixed to a stem 15 in a shape of a plate, optionally, using a heat sink 18, and the inner space 19 of the sleeve portion 8 can be sealed by the stem 15.

A plurality of leads 16a, 16b are provided to the stem 15 in order to electrically connect to an external power source, which leads are provided through a plurality of through-holes provided in the stem 15, respectively.

These through-holes can be further sealed with sealing materials 17a, 17b each of which comprise a material such as a low melting glass.

Herein, the laser diode 1 can be electrically connected to the lead 16a, 16b, respectively, via a conductive member such as a wire.

Such configurations of this embodiment may preferably include the configurations of the above-described first to sixth embodiments illustrated in FIG. 3 to FIG. 10, for example.

Herein, the wavelength converting member 2 and the support member 3 can be adjusted to satisfy the certain relation to provide the similar results.

Although, in this embodiment, other components are not presented between the laser diode 1 and the wavelength converting member 2 or the light transmissive member 4b, for example, other component such as lens enabling to collect the laser light can be provided between them.

INDUSTRIAL APPLICABILITY

The light emitting device according to embodiments of the present invention can be utilized in various applications requiring a light with an improved higher output power, particularly applications requiring a white light having an improved higher output power.

The light emitting device according to embodiments of the present invention can be used, for example, as a lighting device for an endoscope, a fiber scope, etc.

In addition, the light emitting device according to embodiments of the present invention can be utilized in a lighting system used for indoor or outdoor applications, a lighting system for a vehicle, specifically for a headlight, and the like, as a light source.

EXPLANATIONS OF LETTERS OR NUMERALS

1: laser diode (LD)
2: wavelength converting member
3: support member
4: light transmissive member
4a: light transmissive member which is disposed on one surface of the wavelength converting member, which surface is opposed to another surface directed to a laser diode
4b: light transmissive member which is disposed on the surface of the wavelength converting member, which surface is directed to the laser diode
5: through-hole
6: stage
7: base portion
8: sleeve portion
10: first embodiment of the light emitting device according to the present invention
11: lens
12: connector
13: optical fiber
14: adaptor
15: stem
16a: lead
16b: lead
17a: sealing material
17b: sealing material
18: heat sink
19: inner space
20: second embodiment of the light emitting device according to the present invention
30: third embodiment of the light emitting device according to the present invention
40: fourth embodiment of the light emitting device according to the present invention
50: fifth embodiment of the light emitting device according to the present invention
60: sixth embodiment of the light emitting device according to the present invention
70: other embodiment of the light emitting device according to the present invention
A: one surface of the wavelength converting member (or surface A), which surface is opposed to another surface directing to the laser diode
B: another surface of the wavelength converting member (or surface B), which surface is directed to the laser diode
L: optical axis
P: aperture on the base portion of the support member at a side directing to LD (or at a side to which a light travels)
Q: aperture on the base portion of the support member at a side opposed to the side directing to LD (or at a side from which a light travels)
R: aperture on stage 6
S: periphery of stage 6
T: periphery of wavelength converting member 2 being at a side directing to LD (or at a side to which a light travels)
U: periphery of wavelength converting member 2 being at a side opposed to the side directing to LD (or at a side from which a light travels)

What is claimed is:
1. A light emitting device comprising:
a laser diode;
a wavelength converting member configured to convert a wavelength of light emitted from the laser diode, wherein the wavelength converting member comprises a fluorescent material and a binder;
a support member having a through-hole, the support member being configured to support the wavelength converting member such that the light enters the wavelength converting member via a lower surface of the wavelength converting member, and exits the wavelength converting member via an upper surface of the wavelength converting member; and
a light transmissive member fixed to an inner wall of the through-hole of the support member and to the upper surface of the wavelength converting member by fusion bonding, the light transmissive member comprising a fluorescent material,
wherein the binder has a melting point higher than a melting point of the light transmissive member, and
wherein an upper surface of the light transmissive member and an upper surface of the support member are substantially coplanar.

2. The light emitting device according to claim 1, wherein a difference between the melting point of the binder and the melting point of the light transmissive member is within a range from 500° C. to 2500° C.

3. The light emitting device according to claim 1, wherein the binder has a melting point of 1000° C. to 3000° C.

4. The light emitting device according to claim 1, wherein the binder is made of at least one selected from the group consisting of aluminium oxide, silicon dioxide, zirconium oxide, barium oxide and titanium oxide.

5. The light emitting device according to claim 4, wherein the binder is made of aluminium oxide.

6. The light emitting device according to claim 1, wherein the light transmissive member has a melting point of 200° C. to 1000° C.

7. The light emitting device according to claim 1, wherein the light transmissive member is made of at least one material selected from the group consisting of soda glass, borosilicate glass and lead glass.

8. The light emitting device according to claim 7, wherein the light transmissive member is made of borosilicate glass.

9. The light emitting device according to claim 1, wherein the wavelength converting member comprises a light scattering member.

10. The light emitting device according to claim 1, wherein the light transmissive member comprises a light scattering member.

11. A light emitting device comprising:
a laser diode;
a wavelength converting member configured to convert a wavelength of light emitted from the laser diode, wherein the wavelength converting member comprises a fluorescent material and a binder; and
a support member having a through-hole, the support member being configured to support the wavelength converting member such that the light enters the wavelength converting member via a first surface of the wavelength converting member, and exits the wavelength converting member via a second surface of the wavelength converting member;
a first light transmissive member fixed to an inner wall of the through-hole of the support member and to the upper surface of the wavelength converting member by fusion bonding; and
a second light transmissive member fixed to an inner wall of the through-hole of the support member and to the lower surface of the wavelength converting member by fusion bonding,
wherein at least one of the light transmissive members comprises a fluorescent material,
wherein the binder has a melting point higher than a melting point of the light transmissive member, and
wherein an upper surface of the first light transmissive member and an upper surface of the support member are substantially coplanar.

12. The light emitting device according to claim 11, wherein a difference between the melting point of the binder and the melting point of the light transmissive member is within a range from 500° C. to 2500° C.

13. The light emitting device according to claim 11, wherein the binder has a melting point of 1000° C. to 3000° C.

14. The light emitting device according to claim 11, wherein the binder is made of at least one material selected from the group consisting of aluminium oxide, silicon dioxide, zirconium oxide, barium oxide and titanium oxide.

15. The light emitting device according to claim 11, wherein the light transmissive member has a melting point of 200° C. to 1000° C.

16. The light emitting device according to claim 11, wherein the light transmissive member is made of at least one material selected from the group consisting of soda glass, borosilicate glass and lead glass.

17. The light emitting device according to claim 1, wherein the wavelength converting member comprises a fluorescent material adapted to emit a yellow light, and the light transmissive member comprises a fluorescent material adapted to emit a red light.

18. The light emitting device according to claim 11, wherein the wavelength converting member comprises a fluorescent material adapted to emit a yellow light, and at least one of the light transmissive members comprises a fluorescent material adapted to emit a red light.

* * * * *